(12) United States Patent
Shinde et al.

(10) Patent No.: US 11,612,068 B2
(45) Date of Patent: Mar. 21, 2023

(54) ACTUATOR FOR SAFE EXTERNAL ACCESS TO AN ELECTRICAL PANEL BOARD

(71) Applicant: Appleton Grp LLC, Rosemont, IL (US)

(72) Inventors: Tushar H. Shinde, Pune (IN); Vaibhav B. Hande, Pune (IN)

(73) Assignee: Appleton Grp LLC, Rosemont, IL (US)

( * ) Notice: Subject to any disclaimer, the term of this patent is extended or adjusted under 35 U.S.C. 154(b) by 95 days.

(21) Appl. No.: 17/464,895

(22) Filed: Sep. 2, 2021

(65) Prior Publication Data

US 2022/0078933 A1 Mar. 10, 2022

(30) Foreign Application Priority Data

Sep. 9, 2020 (IN) .............................. 202021038963

(51) Int. Cl.
*H05K 5/02* (2006.01)
*H02B 1/056* (2006.01)
*H02B 1/42* (2006.01)

(52) U.S. Cl.
CPC ........... *H05K 5/0221* (2013.01); *H02B 1/056* (2013.01); *H02B 1/42* (2013.01)

(58) Field of Classification Search
CPC .................................................. H05K 5/0221
See application file for complete search history.

(56) References Cited

U.S. PATENT DOCUMENTS

| | | | |
|---|---|---|---|
| 3,272,953 A | 9/1966 | Tillson | |
| 3,534,186 A | 10/1970 | Meyer | |
| 3,609,261 A | 9/1971 | Rys | |
| 4,002,864 A * | 1/1977 | Kuhn | ..................... H02B 11/00 200/50.21 |
| 7,420,133 B2 | 9/2008 | Farrow | |
| 7,446,270 B2 | 11/2008 | Somalingayya et al. | |
| 8,514,551 B2 | 8/2013 | Cosley et al. | |
| 2012/0234778 A1 * | 9/2012 | Anderson | ............ G02B 6/4452 211/26.2 |

OTHER PUBLICATIONS

Examination Report for Indian Patent Application No. 202021038963 dated May 2, 2022, pp. 1-5.

* cited by examiner

*Primary Examiner* — Jerry Wu
(74) *Attorney, Agent, or Firm* — McDonnell Boehnen Hulbert & Berghoff LLP

(57) ABSTRACT

An interlocking external actuator for accessing an electrical panel board having a circuit breaker inside a housing that is covered by an enclosure door, wherein the actuator includes a handle, a first shaft, a second shaft and an interlocking mechanism, wherein the second shaft engages the first shaft in a closed state of the door and thereby facilitates switching the circuit breaker to ON and OFF states by angularly displacing the handle, wherein the interlocking mechanism is biased to engage in pushing the door into a closed state, wherein the circuit breaker is switched from an ON state to an OFF state by displacing the handle from a first angular position to a second angular position, and wherein the interlocking mechanism is disengaged through displacement of the handle further to a third angular position and thereby allow opening of the door.

19 Claims, 14 Drawing Sheets

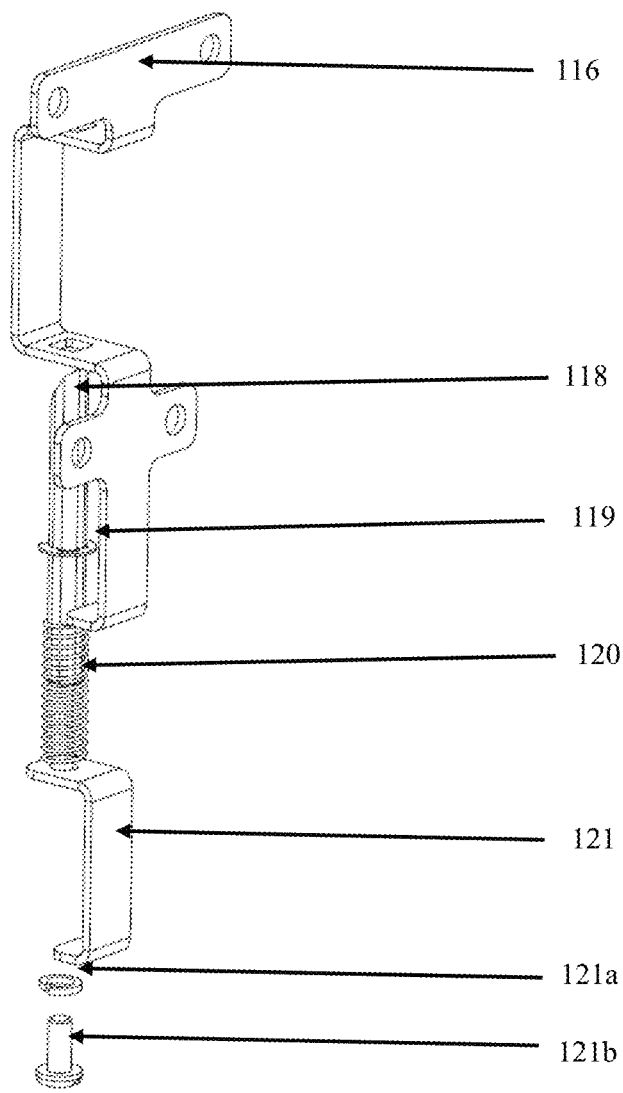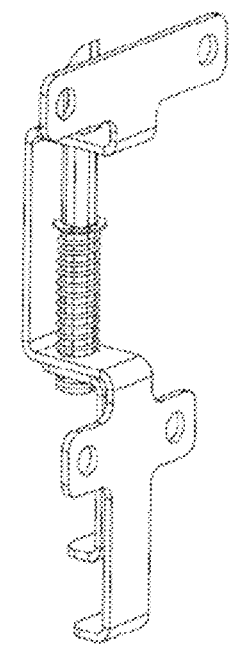
Figure 4A
Figure 4B

ACTUATOR FOR SAFE EXTERNAL ACCESS TO AN ELECTRICAL PANEL BOARD

RELATED APPLICATIONS

This application claims priority to Indian Patent Application No. 202021038963 filed on Sep. 9, 2020, entitled "INTERLOCKING EXTERNAL ACTUATOR FOR SAFE EXTERNAL ACCESS TO AN ELECTRICAL PANEL BOARD," the entire contents of which are incorporated by reference herein in their entirety.

FIELD

The present disclosure relates to the power distribution panels and motor starter panels which incorporate electrical circuit breakers.

BACKGROUND

The background information herein below relates to the present disclosure but is not necessarily prior art.

A power distribution panel is an essential component of every electricity supply system. Power distribution panels receive electrical power from a power station and feed the received electrical power to different circuits while providing protective and efficient fuse and circuit breakers for every circuit and can be accessed with simplicity in case of an electrical fault. The circuit breakers can be switched to an ON and an OFF position using an external actuator. These existing actuators are only able to make electrical breaker switch ON and OFF from outside the panel. Existing actuators can be locked from outside of panel in the breaker ON and OFF positions. However, these actuators do not provide a locking feature which would ensure that the panel door remains closed when the breaker is in the ON state. This may compromise electrical safety due to non-locking of the panel door as there is no provision of door locking and one can open the panel door when the breaker is in the ON state, due to which the person may come in contact with live electrical parts. Thus, such a situation may cause hazardous accidents if the operator does not take every precautionary measure.

Further, even when external actuator handle mechanisms are provided, they are manufactured specifically for breakers and panel boards of specific designs and dimensions only. These external actuators handle mechanisms cannot be used on panel boards and breakers of different designs and dimensions. Furthermore, these external actuators are not suitable for applications with minor or major modifications and have limitation for use with panels with varying heights.

There is, therefore, felt a need for an external actuator system for safe access to electrical panel boards.

OBJECTS

Some of the objects of the present disclosure, which at least one embodiment herein satisfies, are as follows:

An object of the present disclosure is to provide an external actuator system for safe access to electrical panel boards.

Another object of the present disclosure is to provide an external actuator system that is compatible with electrical panel boards and breakers of different designs and dimensions.

Yet another object of the present disclosure is to provide an external actuator system for circuit breakers that facilitates turning the circuit breaker ON-OFF manually from outside the panel door.

Still another object of the present disclosure is to provide an external actuator system which prevents opening of the panel door when breaker is in the ON state.

Still another object of the present disclosure is to provide an external actuator system which allows for bypassing the interlock and open the door for service and maintenance purposes when the breaker is ON.

Still another object of the present disclosure is to provide an external actuator system suitable to maintain existing IP66 ratings on the panel.

Other objects and advantages of the present disclosure will be more apparent from the following description, which is not intended to limit the scope of the present disclosure.

SUMMARY

The present disclosure envisages an interlocking external actuator for safe external access to an electrical panel board. The electrical panel board having a circuit breaker and housed inside a housing and the housing is covered by an enclosure door. The actuator comprising a handle, a first shaft, a second shaft and an interlocking mechanism. The handle is mounted on an external surface of the door. The handle is configured to be handled for angular displacement. The first shaft is configured to pass through the door, extending into said housing and facilitate rotation of the handle. The second shaft is coupled to a switching element of the circuit breaker. The second shaft is configured to engage with the first shaft in a closed state of the door and thereby facilitate switching of the circuit breaker to ON and OFF states by angularly displacing the handle. The interlocking mechanism is located between the door and the panel board. the interlocking mechanism is biased to engage on pushing the door in a closed state and thereby lock the door in said closed state. The handle is configured to be displaced from a first angular position to a second angular position and from said second angular position to a third angular position away from said first angular position. The circuit breaker is configured to be switched from an ON state to an OFF state on displacing said handle from the first angular position to the second angular position. The interlocking mechanism is configured to be disengaged through displacement of the handle further to the third angular position and thereby allow opening of the door.

In an embodiment the first shaft is provided with a male protrusion and the second shaft is provided with a female recess or vice versa.

In an embodiment the female recess is configured to receive the male protrusion when the door is in the closed state.

In an embodiment the interlocking external actuator comprises an actuator plate assembly assembled on a cover plate mounted on a circuit breaker.

In an embodiment the actuator plate assembly consists of an actuator plate functionally coupled with the second shaft assembled on a mounting plate mounted on the cover plate.

In an embodiment the interlocking mechanism comprises a plunger and spring mechanism having a plunger and a spring mounted on the enclosure door internally using a plunger mounting bracket, a defeat action link connecting the plunger and spring mechanism with the handle, a locking bracket mounted on the cover plate and when the enclosure door is in closed state the plunger is engaged with a slot provided on the locking bracket.

In an embodiment the handle comprises, a handle guard and a handle spacer functionally connected to the handle.

In an embodiment the interlocking external actuator comprises a defeat mechanism having a quarter turn latch mounted on the enclosure door and is functionally connected to the plunger and spring mechanism using an actuator link.

In an embodiment the quarter turn latch is operated using a special key, which when angularly displaced disengages the plunger from the slot provided on the locking bracket.

In an embodiment the defeat action link is provided with a slot to accommodate the first shaft.

In an embodiment the defeat action link is constrained from operating the plunger and spring mechanism during angular displacement of the handle form the first angular position to the second angular position.

In an embodiment the defeat action link operates the plunger and spring mechanism during angular displacement of the handle from the second angular position to the third angular position.

In an embodiment the interlocking external actuator can be mounted on a breaker group consisting of a single combination contactor panel, a multiple contactor panel with main breaker, a single combination starter panel, a multiple starter panel with Main Breaker, an RF panel with main breaker, an RQ panel with Main Breaker and a disconnect switch panel.

In an embodiment the plunger and spring mechanism can be mounted on the cover plate of the circuit breaker.

In an embodiment the male protrusion and the female recess can be of polygonal or toothed shaped design.

In an embodiment the plunger mounting bracket is mounted on the enclosure door using welded studs and nuts.

In an embodiment the plunger mounting bracket is mounted on the enclosure door using a self-sealing fastener.

In an embodiment the plunger and Spring assembly is mounted on an F-frame breaker toggle plate.

In an embodiment the interlocking mechanism consists of an integrated interlocking plate with a base plate.

BRIEF DESCRIPTION OF THE ACCOMPANYING DRAWING

The interlocking external actuator of the present disclosure will now be described with the help of the accompanying drawing, in which:

FIG. 4A illustrates an exploded view of a spring-plunger assembly;

FIG. 4B illustrates an isometric view of a spring-plunger assembly in an assembled form;

LIST OF REFERENCE NUMERALS

Figure 1:
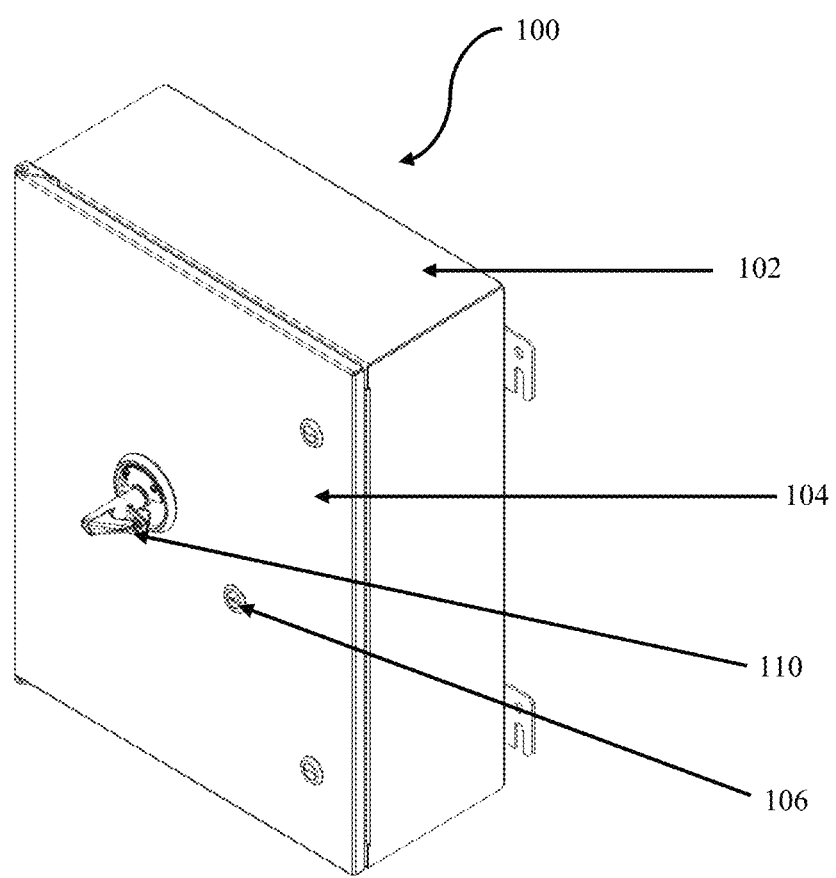
FIG. 1 illustrates an isometric view of an inter lockable external actuator assembled on panel door.

100—Interlocking external actuator
102—Housing
104—Enclosure door
106—Screw
110—Handle
111—First shaft
112—Male protrusion
114—Defeat action link
115—Slot
116—Plunger mounting bracket
118—Plunger
119—Circlip
120—Spring
121—Actuation link
122—Circuit Breaker
124—Cover Plate
125—Second shaft
126—Female recess
127—Bush
128—Mounting plate
129—Nut
130—Actuator Plate
131—Washer
132—Screw
134—locking bracket
135—Slot
140—Quarter Turn Latch
141—Integrated interlocking plate

DETAILED DESCRIPTION

Embodiments, of the present disclosure, will now be described with reference to the accompanying drawing.

Embodiments are provided so as to thoroughly and fully convey the scope of the present disclosure to the person skilled in the art. Numerous details are set forth, relating to specific components, and methods, to provide a complete understanding of embodiments of the present disclosure. It will be apparent to the person skilled in the art that the details provided in the embodiments should not be construed to limit the scope of the present disclosure. In some embodiments, well-known processes, well-known apparatus structures, and well-known techniques are not described in detail.

The terminology used, in the present disclosure, is only for the purpose of explaining a particular embodiment and such terminology shall not be considered to limit the scope of the present disclosure. As used in the present disclosure, the forms "a", "an" and "the" may be intended to include the plural forms as well, unless the context clearly suggests otherwise. The terms "comprises", "comprising", "including" and "having" are open ended transitional phrases and therefore specify the presence of stated features, elements, modules, units and/or components, but do not forbid the presence or addition of one or more other features, elements, components, and/or groups thereof.

The terms first, second, third, etc., should not be construed to limit the scope of the present disclosure as the aforementioned terms may be only used to distinguish one element, component or section from another component or section. Terms such as first, second, third etc., when used herein do not imply a specific sequence or order unless clearly suggested by the present disclosure.

A power distribution panel is an essential component of every electricity supply system. Power distribution panels receive electrical power from a power station and feed the received electrical power to different circuits while providing protective and efficient fuse and circuit breakers for every circuit and can be accessed with simplicity in case of an electrical fault. The circuit breakers can be switched to an ON and an OFF position using an external actuator. These existing actuators are only able to make an electrical breaker switch ON and OFF from outside the panel. Existing actuators can be locked from outside of panel in breaker ON and OFF positions. However, these actuators do not provide a locking feature which would ensure that the panel door remains closed when the breaker is in the ON state. This may compromise electrical safety due to non-locking of the panel door as there is no provision of door locking and one can open the panel door when the breaker is in the ON state, due to which the person may come in contact with live electrical parts. Thus, such a situation may cause hazardous accidents if the operator does not take every precautionary measure.

Further, even when external actuator handle mechanisms are provided, they are manufactured specifically for breakers and panel boards of specific designs and dimensions only. These external actuators handle mechanisms cannot be used on panel boards and breakers of different designs and dimensions. Furthermore, these external actuators are not suitable for applications with minor or major modifications and have limitations for use with panels with varying heights.

The interlocking external actuator 100 shall be described in detail with reference to FIGS. 1-12C.

Figure 2:
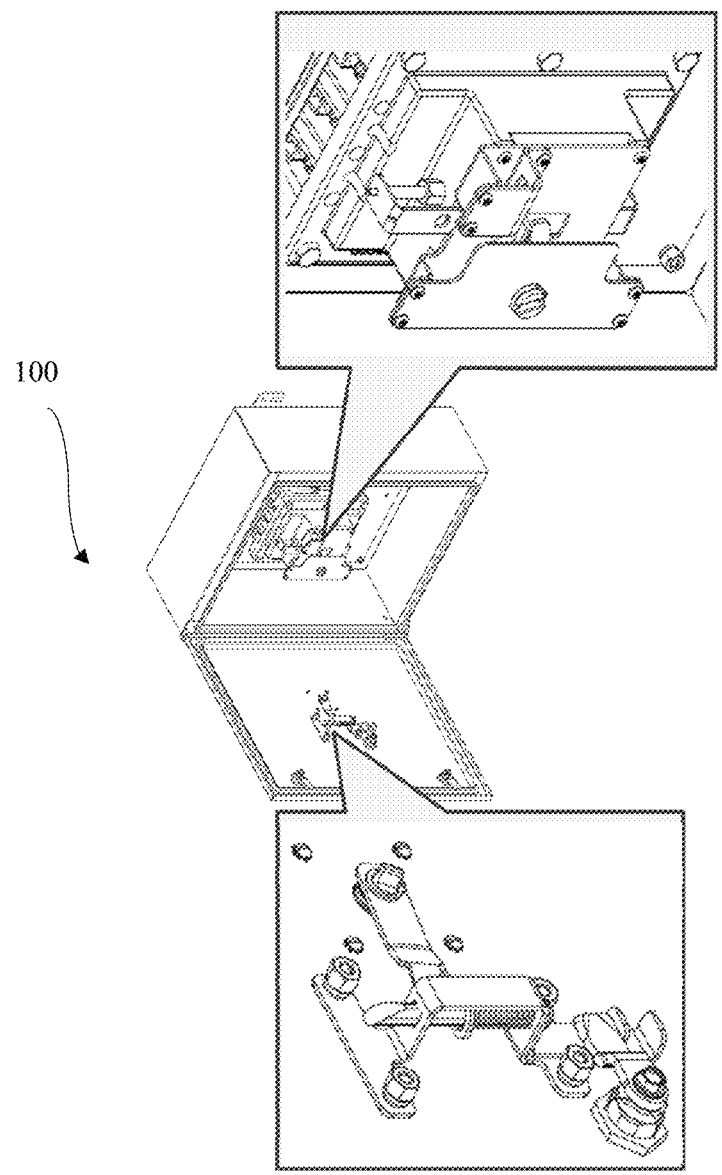
FIG. 2 illustrates enlarged views from a panel door opened position, of door-side links and panel-side links of the actuator, in accordance with the present disclosure.

The present disclosure envisages an interlocking external actuator 100 for safe access to an electrical panel board as shown in FIG. 1 and FIG. 2. The electrical panel board is provided with a circuit breaker 122 for facilitating supply of electrical current within the electrical panel board. The electrical panel board is housed inside a housing 102 having an opening to access the electrical panel board. The opening in the housing 102 is covered by an enclosure door 104. In an operative state the enclosure door 104 can be displaced to access the electrical panel board through the opening.

The interlocking external actuator 100 comprises a handle assembly, an actuator plate assembly and an interlocking mechanism. FIG. 2 discloses an internal view of the housing 102. The handle assembly is assembled on the enclosure door 104. The handle assembly comprises a handle 110, a first shaft 111 provided with a male protrusion 112. FIG. 3C shows the first shaft 111. The handle 110 is mounted on said enclosure door 104. The handle is configured to operate the circuit breaker 122 from OFF to ON states and vice versa by angularly displacing the handle 122 from a first position to a second position and from the second position to a third position away from the first position. The first shaft 111 is functionally connected to the handle 110.

The handle is configured to be angularly displaced in at least three angular positions. In a first angular position, the breaker is in an ON condition. In a second angular position the breaker is in an OFF condition. In both the first and the second angular positions the door is in a locked condition and in the third angular position the door is in an unlocked position.

The handle assembly is further provided with a handle guard and a handle spacer functionally connected to the handle. The handle 110 and the operator handle guard are provided with a slot for locking the operator handle in place.

Figure 3A:
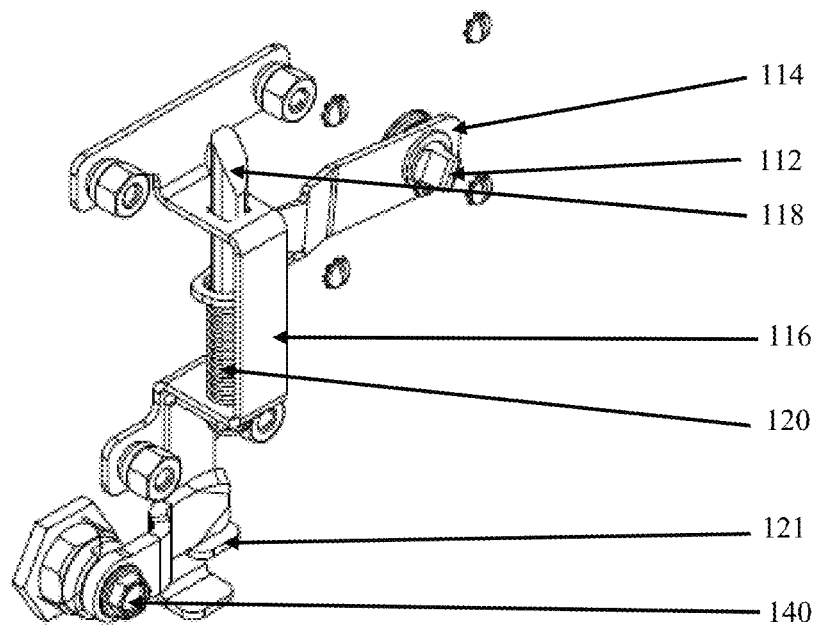
FIG. 3A illustrates an isometric view of a plunger-spring and latch assembly on the panel door.
Figure 3B:
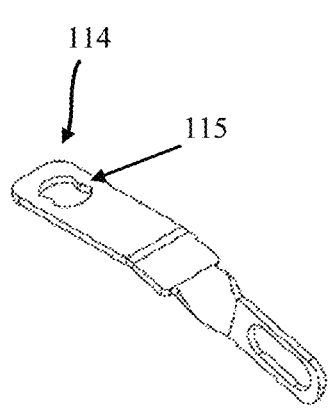
FIG. 3B illustrates an isometric view of a defeat link.
Figure 3C:
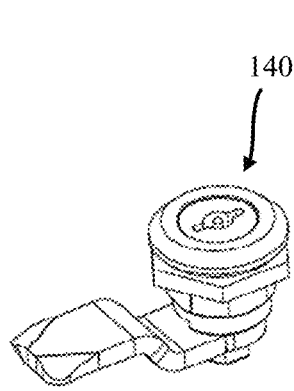
FIG. 3C illustrates an isometric view of a quarter turn latch.
Figure 3D:
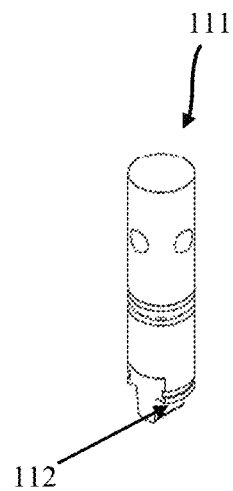
FIG. 3D illustrates an isometric view of a flat male protrusion shaft.
Figure 4C:
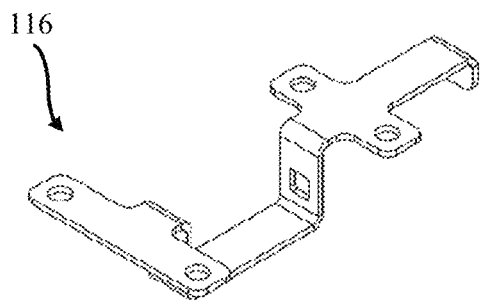
FIG. 4C illustrates an isometric view of a plunger mounting bracket.
Figure 4D:
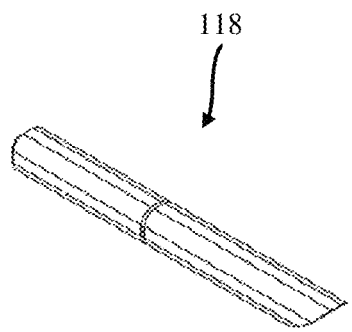
FIG. 4D illustrates an isometric view of a plunger.
Figure 4E:
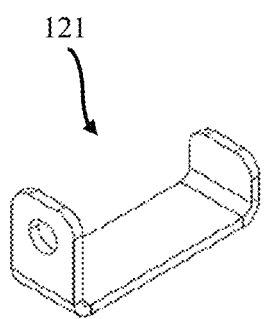
FIG. 4E illustrates an isometric view of an actuator link.
Figure 5A:
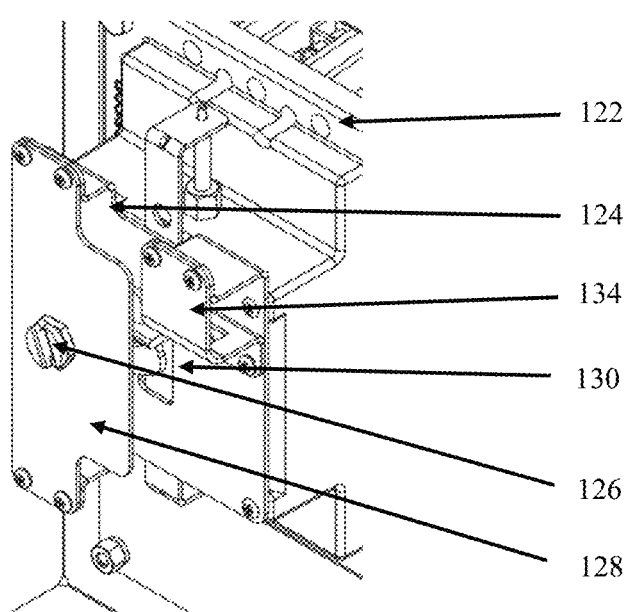
FIG. 5A illustrates an isometric view of an actuator plate assembly on a breaker cover plate.
Figure 5B:
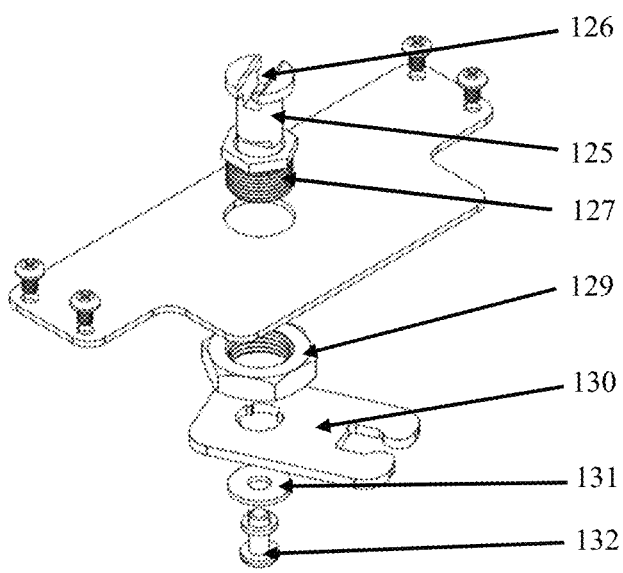
FIG. 5B illustrates an exploded view of the actuator plate assembly on the breaker cover plate of FIG. 5A.
Figure 5C:
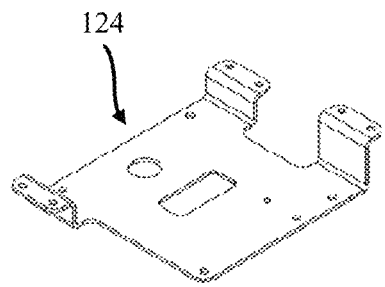
FIG. 5C illustrates an isometric view of a cover plate.
Figure 5D:
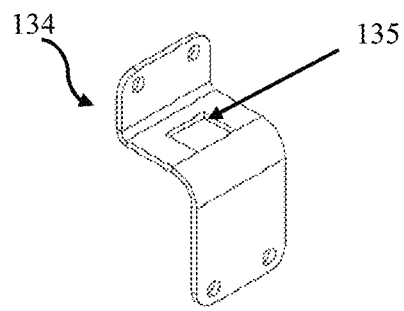
FIG. 5D illustrates an isometric view of a plunger locking plate.
Figure 5E:
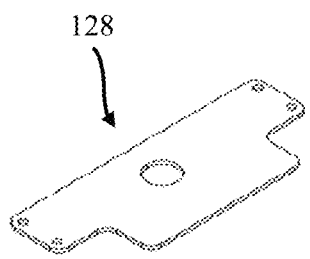
FIG. 5E illustrates an isometric view of a mounting plate.
Figure 5F:
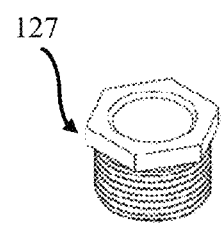
FIG. 5F illustrates an isometric view of a bush.
Figure 5G:
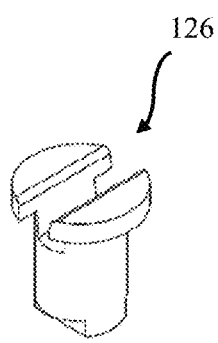
FIG. 5G illustrates an isometric view of a flat female recess shaft.
Figure 5H:
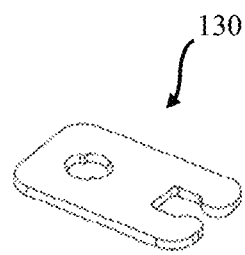
FIG. 5H illustrates an isometric view of an actuator plate.

FIGS. 3A-D and FIGS. 4A-E disclose a plunger and spring mechanism. The plunger and spring mechanism is provided with a plunger 118 and a spring 120 mounted on the enclosure door 104 internally using a plunger mounting bracket 116. The plunger mounting bracket 116 is mounted on the enclosure door 104 using welded studs and nuts or a self-sealing fastener. The plunger and spring mechanism is also provided with a defeat action link 114 having a slot 115. FIG. 3A shows a defeat action link 114 with a slot 115. The defeat action link 114 functionally connects the handle 110 to the plunger 118 using a circlip 119. An actuation link 121 is functionally connected to the plunger using a fastener such that the by displacing the actuator link 121 the plunger is also displaced from its locking position.

FIG. 5A-5H discloses the actuator plate assembly mounted on a cover plate 124 of the circuit breaker 122 and its components. The actuator plate assembly comprises a second shaft 125 with a female recess 126 mounted on to the mounting plate 128 using a fastener. The mounting plate 128 is in turn mounted onto the cover plate 124 of the circuit breaker 122. When the enclosure door 104 is in a closed state the female recess 126 and the male protrusion 112 engage each other and the circuit breaker is turned ON and OFF by angularly displacing the handle 110. When the enclosure door 104 is in the open state, the female recess 126 and the male protrusion 112 disengage each other and the breaker can't be operated manually.

The actuator plate assembly further comprises an actuator plate 130 functionally connected to the second shaft 125 with female recess 126 using a fastener. The actuator plate 130 is rotationally displaced along with rotation of the second shaft 125 actuating the breaker in ON or OFF states. In the closed state the breaker 122 can be operated in ON or OFF states using handle 110.

A locking bracket 134 is also provided on the cover plate 124. The locking bracket 134 is provided with a slot 135. The slot 135 complements the plunger 118 in enclosure door 104 in the closed state locking the enclosure door 104.

When enclosure door 104 starts closing at a breaker OFF state, the plunger 118 is displaced by compressing the spring due to locking bracket 134. The plunger 118 engages the slot 135 provided on the locking bracket 134. Due to the plunger 118 engagement with locking bracket 134 the enclosure door 104 is interlocked and can't be opened when circuit breaker 122 is in the ON state.

Figure 6A:
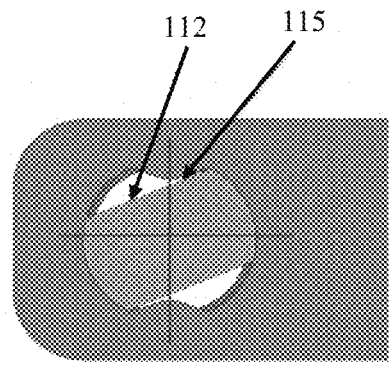
FIG. 6A illustrates the first shaft inside the slot of the defeat link when the breaker is in the ON state.
Figure 6B:
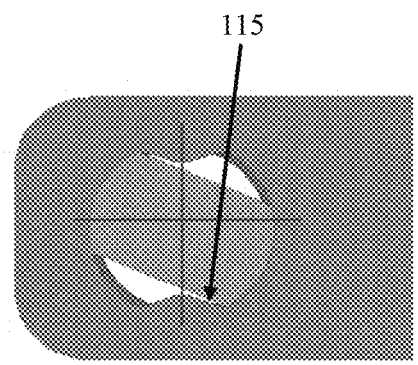
FIG. 6B illustrates the first shaft inside the slot of the defeat link when the breaker is in the OFF state.
Figure 6C:
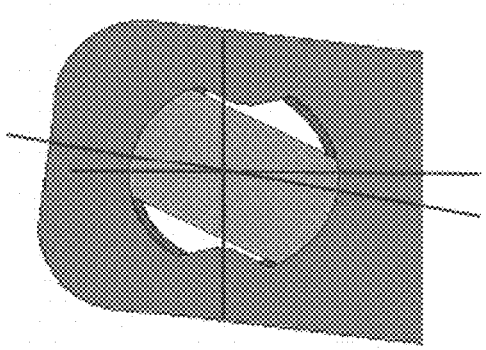
FIG. 6C illustrates the first shaft inside the slot of the defeat link when the defeat link is operated.

FIGS. 6A-6C depict the working of defeat action link 114. The defeat action link 114 is provided with the slot 115. The defeat action link 114 is mounted on first shaft 111. FIG. 6A depicts the position of the shaft inside the slot 115.

In the door closed state and the handle 110 is in the ON position, initial rotation of the handle 110 to the OFF position only rotates the first shaft 111 along with the handle 110. There will be no rotation of defeat action 114 link for initial angle of rotation of the handle 110 because first shaft 111 rotates freely inside defeat link slot 115. After the first initial rotation the edge of first shaft 111 contacts the edge of slot 115 on defeat action link 114 as shown in FIG. 6B. Further rotation of the handle 110 for making breaker OFF will cause the defeat action link 114 to rotate with handle because of the engagement of shaft edge and slot edge. After initial angle rotation of handle 110, further intermittent angle of rotation of defeat link 114 will disengage the plunger 118 from locking bracket 134.

The shape of slot 115 on the defeat link 114 is designed so that it will give continuous rotary motion of handle in the initial rotation and intermittent rotary motion.

For opening the enclosure door 104 and achieving defeat action when breaker is in the ON state, quarter turn latch 140 is provided as shown in FIG. 3A. The quarter turn latch 140 is operated with a special key which will compress the spring by displacing the actuation link 121 which in turn disengages the plunger 118 from the slot 135 in the locking bracket 134. With the provision of quarter turn latch 140 the enclosure door 104 can be opened for maintenance even when the breaker is in the ON state. The quarter turn latch mechanism is suitable for IP66 requirements.

Figure 7:
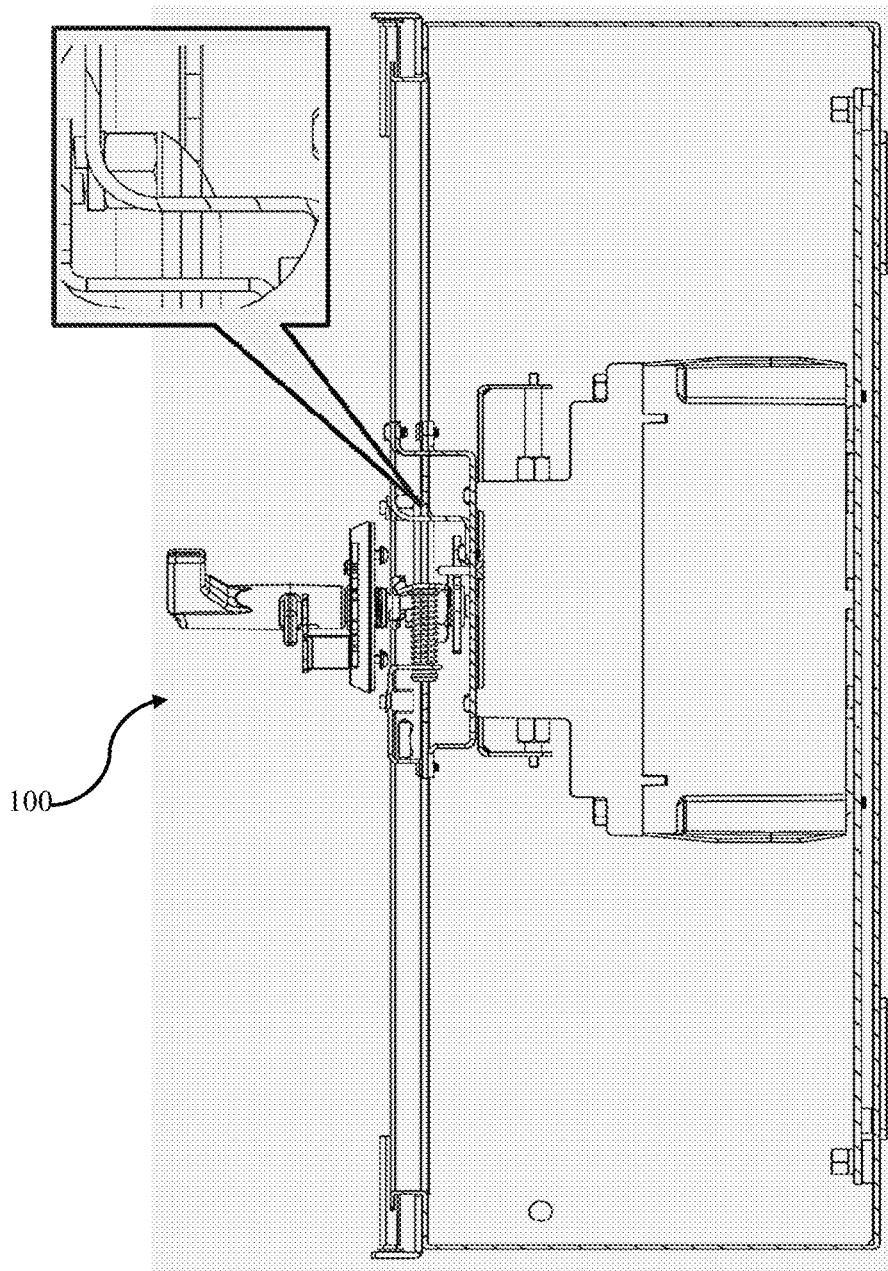
FIG. 7 illustrates a sectional side view of the door in an interlocked state with an enlarged view of the plunger.

FIG. 7 illustrates enclosure door 104 in a locked state. In the locked state the plunger 118 is engaged with the slot 135 on the locking bracket 134 mounted on the cover plate 134 of the circuit breaker 122 interlocking the enclosure door 104.

Figure 8:
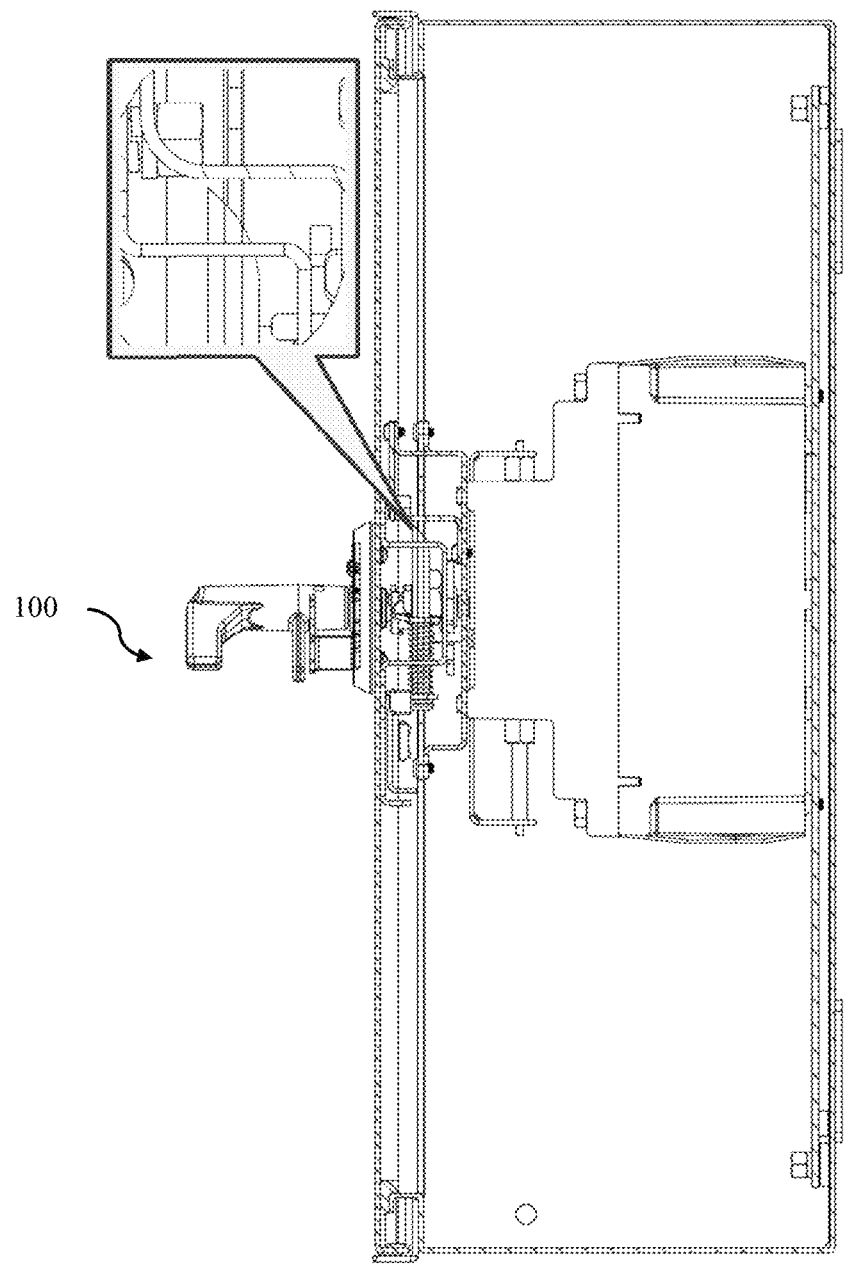
FIG. 8 illustrates a sectional side view of the door in an unlocked state with an enlarged view of the plunger.

FIG. 8 illustrates enclosure door 104 in an unlocked state. In the unlocked state the plunger 118 is disengaged with the slot 135 on the locking bracket 134 mounted on the cover plate 134 of the circuit breaker 122 unlocking the enclosure door 104.

Figure 9:
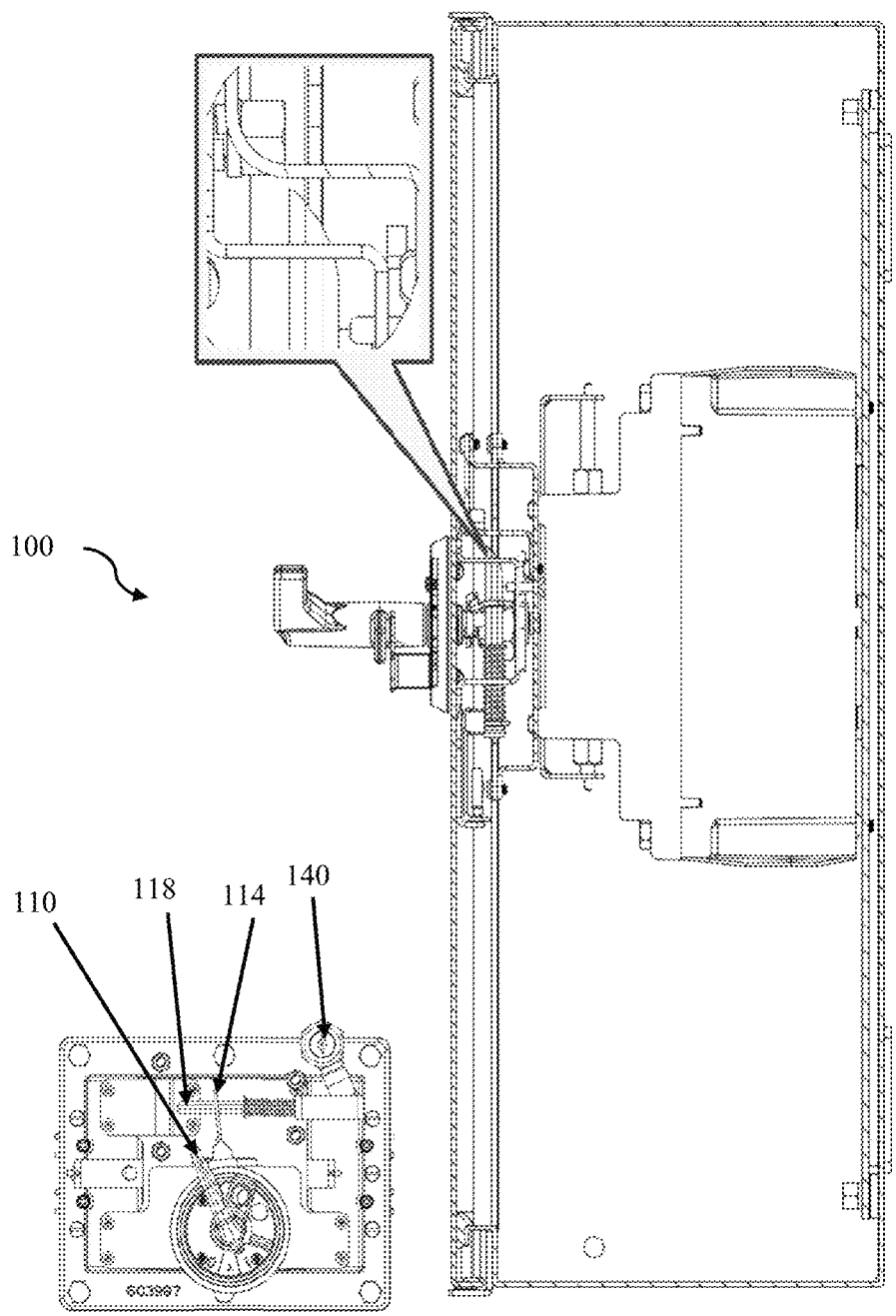
FIG. 9 illustrates a sectional side view of the door with an enlarged view of the disengaged plunger from the locking plate.

FIG. 9 illustrates the working of quarter turn latch mechanism 140. The quarter turn latch is operated when the circuit breaker 122 is in the ON state and the enclosure door 104 is interlocked. During the operation of the quarter turn latch mechanism 140 the spring 120 is compressed by displacing the actuation link 121 which in turn disengages the plunger 118 from the slot 135 in the locking bracket 134 and there by unlocking the door in the breaker ON state.

The present invention is suitable to maintain existing IP66 ratings on electrical control panels. The interlocking external actuator 100 of the present invention can be mounted on a breaker group consisting of a single combination contactor panel, a multiple contactor panel with main breaker, a single combination starter panel, a multiple starter panel with Main Breaker, an RF panel with main breaker, an RQ panel with Main Breaker, and a disconnect switch panel.

The present invention is suitable for an F-Frame breaker when used as a Main breaker in the Panel. Dimensional modification can facilitate the present invention to be made suitable for QC and F-Frame breakers which are used as Branch breakers in Panel.

The present invention can also be made suitable for other electrical circuit breakers which are having similar operating principle as transverse motion of actuation. Dimensional modification of slot 115 on defeat link 114 can be done to get required rotations angle of defeat link 114 and handle 110.

Figure 10:
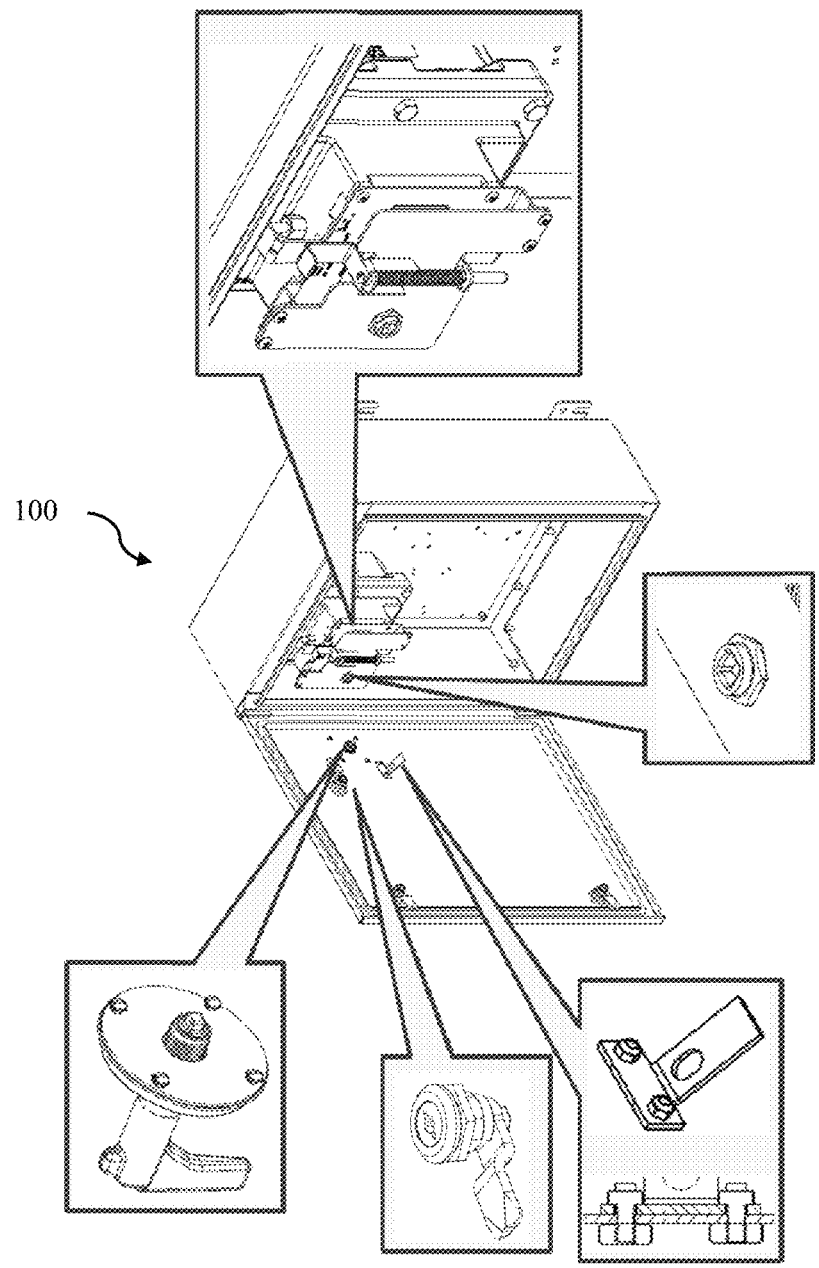
FIG. 10 illustrates an isometric view of an alternate embodiment of the inter-lockable external actuator with enlarged views of a latch mechanism and an interlocking mechanism in accordance with the present disclosure.
Figure 11:
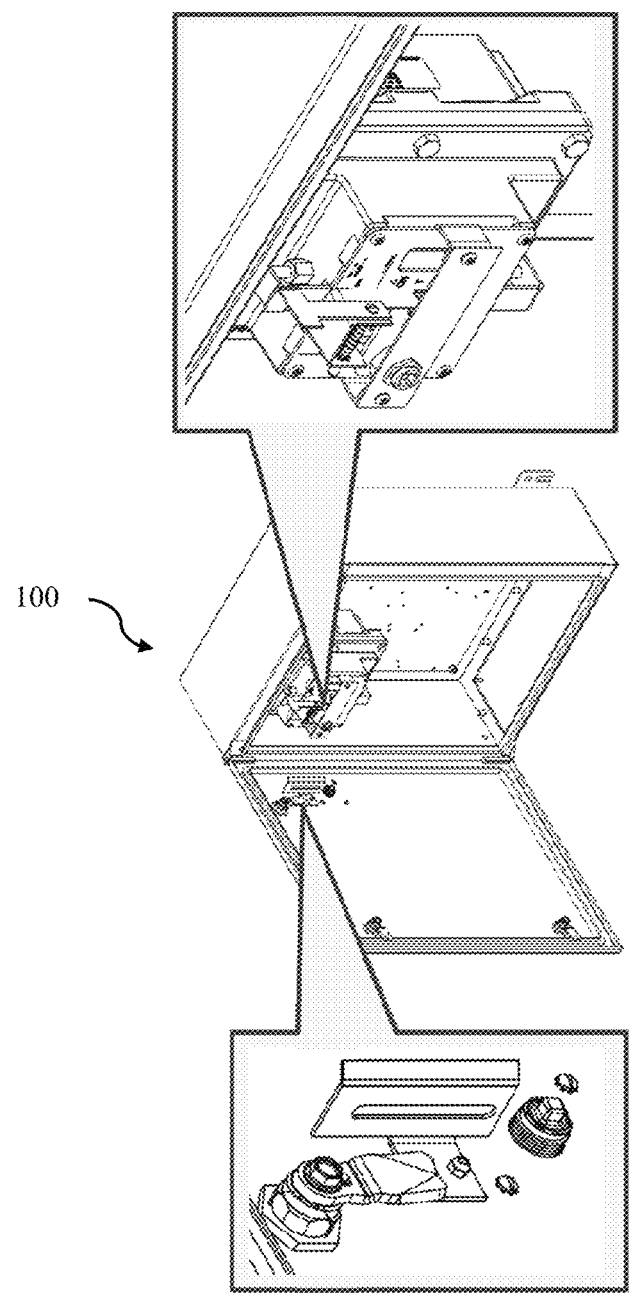
FIG. 11 illustrates another isometric view of an alternate embodiment of the inter-lockable external actuator with enlarged views of a latch mechanism and an interlocking mechanism in accordance with the present disclosure.
Figure 12A:
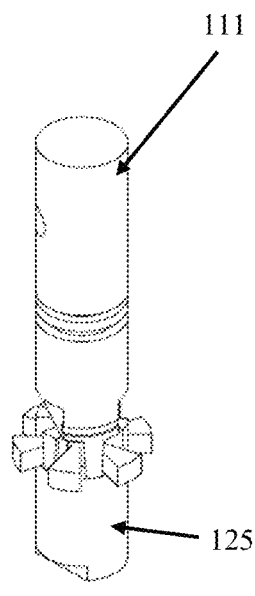
FIG. 12A illustrates an isometric view of engaged toothed male and female shafts.
Figure 12B:
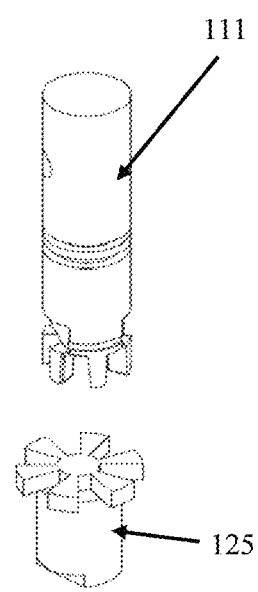
FIG. 12B illustrates an isometric view of disengaged toothed male and female shafts.

In an alternate embodiment the plunger and spring mechanism are mounted on the cover plate 124 of the circuit breaker 122 as shown in FIG. 10 and FIG. 11. Further the locking bracket with a slot is mounted on the enclosure door 104. Further the shape of the male protrusion and female recess can be of flat, polygonal or toothed shape design as shown in FIGS. 12A and 12B.

Figure 12C:
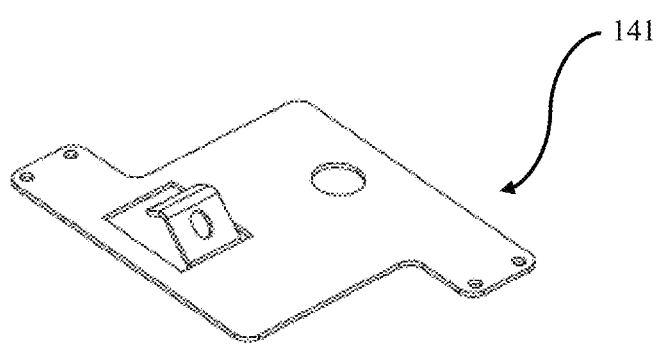
FIG. 12C illustrates an isometric view of an integrated interlocking plate with a base plate.

Further the interlocking mechanism can also be provided with a base plate design as shown in FIG. 11 and FIG. 12C.

The working of the interlocking external actuator 100 of the present disclosure is described below.

In enclosure door 104 closed state, the plunger is locked inside the slot 135 of the locking bracket 134 securing the enclosure door 104 to the housing 102. Further the handle 110 is in its first position and the breaker is in the ON state. For opening the enclosure door 104 to access the electrical panel board, the handle 110 has to be angularly displaced from the first position to the second position during which the first shaft 111 rotates along with the handle 110 inside the slot 115 of the defeat link 114 which in turn rotates the second shaft 125 to switch the breaker from the ON state to the OFF state. In the next step, the handle 100 is angularly displaced from the second position to the third position during which the edge of the first shaft 111 locks into the edge of the slot 115 provided on the defeat link 114 and angularly displaces the defeat link 114 along with the handle 110. The angular displacement of the defeat link 114 compresses the spring 120 which in turn displaces the plunger 118 from the slot 135 on the locking bracket 134. Therefore, the door 104 is unlocked only when the handle 110 is in the breaker OFF state thereby preventing the operator/person from accidental contact with live electrical parts.

The foregoing description of the embodiments has been provided for purposes of illustration and not intended to limit the scope of the present disclosure. Individual components of a particular embodiment are generally not limited to that particular embodiment, but, are interchangeable. Such variations are not to be regarded as a departure from the present disclosure, and all such modifications are considered to be within the scope of the present disclosure.

Technical Advancements

The present disclosure described herein above has several technical advantages including, but not limited to, the realization of an interlocking external actuator for safe access to electrical panel boards, which:

has a panel door that interlocks when the door is closed, and the breaker is in the ON state;
  has a defeat action when breaker is in the ON state by using special quarter turn latch and having a special key which is used to operate the latch mechanism for defeat action;

provides electrical safety due to interlocking of panel door as it avoids door opening in the breaker ON state and avoids contact of person from electrically live parts;

provides breaker locking when the panel door is opened and restricts the manual operation of breaker when the panel door is in an opened state;

provides an automatic mechanism engagement with breaker and interlocking with door;

provides an external actuator with spring and plunger invention that satisfies the IP66 requirements of the panel;

restricts the operation of breaker outside the panel in ON or OFF states;

has a mechanism that can be locked out from outside of the panel with padlocks in breaker ON or OFF states; and provides electrical safety to the operator operating the electrical control panel boards.

The embodiments herein and the various features and advantageous details thereof are explained with reference to the non-limiting embodiments in the following description. Descriptions of well-known components and processing techniques are omitted so as to not unnecessarily obscure the embodiments herein.

The foregoing description of the specific embodiments so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

The use of the expression "at least" or "at least one" suggests the use of one or more elements or ingredients or quantities, as the use may be in the embodiment of the disclosure to achieve one or more of the desired objects or results.

While considerable emphasis has been placed herein on the components and component parts of the preferred embodiments, it will be appreciated that many embodiments can be made and that many changes can be made in the preferred embodiments without departing from the principles of the disclosure. These and other changes in the preferred embodiment as well as other embodiments of the disclosure will be apparent to those skilled in the art from the disclosure herein, whereby it is to be distinctly understood that the foregoing descriptive matter is to be interpreted merely as illustrative of the disclosure and not as a limitation.

We claim:

1. An interlocking external actuator (100) for safe external access to an electrical panel board, said electrical panel board having a circuit breaker and housed inside a housing (102), said housing (102) covered by an enclosure door (104), said actuator (100) comprising:
   a. a handle (110) mounted on an external surface of said enclosure door (104) and configured to be handled for angular displacement;
   b. a first shaft (112) passing through said enclosure door (104), extending into said housing (102) and facilitating rotation of said handle (110);
   c. a second shaft (126) coupled to a switching element of said circuit breaker (122), said second shaft (126) configured to engage with said first shaft (112) in a closed state of said enclosure door (104) and thereby facilitate switching of said circuit breaker (122) to ON and OFF states by angular displacement of said handle (110);
   d. an interlocking mechanism located between said door (104) and said electrical panel board, said interlocking mechanism biased to engage in pushing said door into a closed state and thereby locking said enclosure door (104) in said closed state;
   wherein said handle (110) is configured to be displaced from a first angular position to a second angular position and from said second angular position to a third angular position away from said first angular position, said circuit breaker (122) configured to be switched from an ON state to an OFF state on displacing said handle (110) from said first angular position to said second angular position, said interlocking mechanism configured to be disengaged through displacement of said handle (112) further to said third angular position and thereby allow opening said enclosure door (104).

2. The interlocking external actuator (100) as claimed in claim 1, wherein the first shaft (111) is provided with a male protrusion (112) and the second shaft (125) is provided with a female recess (126) or vice versa.

3. The interlocking external actuator (100) as claimed in claim 2, wherein the female recess (126) is configured to receive the male protrusion (112) when said door (104) is in the closed state.

4. The interlocking external actuator (100) as claimed in claim 1, comprising an actuator plate assembly assembled on a cover plate (124) mounted on a circuit breaker (122).

5. The interlocking external actuator (100) as claimed in claim 4, wherein the actuator plate assembly consists of an actuator plate (130) functionally coupled with the second shaft (125) assembled on a mounting plate (128) mounted on the cover plate (124).

6. The interlocking external actuator (100) as claimed in claim 1, wherein the interlocking mechanism comprises:
   a plunger and spring mechanism having a plunger (118) and a spring (120) mounted on the enclosure door (104) internally using a plunger mounting bracket (116)
   a defeat action link (114) connecting the plunger and spring mechanism with the handle (110),
   a locking bracket (134) mounted on the cover plate (124), wherein when the enclosure door (104) is in the closed state the plunger (118) is engaged with a slot (135) provided on the locking bracket (134).

7. The interlocking external actuator (100) as claimed in claim 1, wherein the handle further comprises, a handle guard and a handle spacer functionally connected to the handle (110).

8. The interlocking external actuator (100) as claimed in claim 1, further comprising a defeat mechanism having a quarter turn latch (140) mounted on the enclosure door (104) and is functionally connected to the plunger and spring mechanism using an actuator link (121).

9. The interlocking external actuator (100) as claimed in claim 8, wherein the quarter turn latch (140) is operated using a special key, which when angularly displaced disengages the plunger (118) from the slot (135) provided on the locking bracket (134).

10. The interlocking external actuator (100) as claimed in claim 1, wherein the defeat action link (114) is provided with a slot (115) to accommodate the first shaft (111).

11. The interlocking external actuator (100) as claimed in claim 10, wherein the defeat action link (114) is constrained from operating the plunger and spring mechanism during angular displacement of the handle (110) from the first angular position to the second angular position.

12. The interlocking external actuator (100) as claimed in claim 10, wherein the defeat action link (114) operates the plunger and spring mechanism during angular displacement of the handle (110) from the second angular position to the third angular position.

13. The interlocking external actuator (100) as claimed in claim 1, wherein the interlocking external actuator (100) can be mounted on a breaker group consisting of a single combination contactor panel, a multiple contactor panel with main breaker, a single combination starter panel, a multiple starter panel with Main Breaker, an RF panel with main breaker, an RQ panel with Main Breaker, and a disconnect switch panel.

14. The interlocking external actuator (100) as claimed in claim 1, wherein the plunger and spring mechanism can be mounted on the cover plate (124) of the circuit breaker (122).

15. The interlocking external actuator (100) as claimed in claim 1, wherein the male protrusion (112) and the female recess (114) can be of polygonal or toothed shaped design.

16. The interlocking external actuator (100) as claimed in claim 1, wherein the plunger mounting bracket (116) is mounted on the enclosure door (104) using welded studs and nuts.

17. The interlocking external actuator (100) as claimed in claim 1, wherein the plunger mounting bracket (116) is mounted on the enclosure door (104) using a self-sealing fastener.

18. The interlocking external actuator (100) as claimed in claim 1, wherein the plunger and Spring assembly is mounted on an F-frame breaker toggle plate.

19. The interlocking external actuator (100) as claimed in claim 1, wherein the interlocking mechanism consists of an integrated interlocking plate (141) with a base plate.

* * * * *